United States Patent [19]
Chalupka et al.

[11] Patent Number: 5,378,917
[45] Date of Patent: Jan. 3, 1995

[54] PARTICLE-BEAM IMAGING SYSTEM

[75] Inventors: Alfred Chalupka, Wien; Gerhard Stengl, Wernberg; Herbert Vonach, Klosterneuburg, all of Austria

[73] Assignee: IMS Ionen Mikrofabrations Systeme Gesellschaft m.b.H., Vienna, Austria

[21] Appl. No.: 40,536

[22] Filed: Mar. 30, 1993

[30] Foreign Application Priority Data

Mar. 30, 1992 [AT] Austria .................. 638/92

[51] Int. Cl.$^6$ ........................... H01J 37/30
[52] U.S. Cl. .................. 250/492.21; 250/398
[58] Field of Search ........... 250/492.21, 492.3, 398, 250/396 R, 492.2

[56] References Cited

U.S. PATENT DOCUMENTS 4,985,634 1/1991 Stengl et al. ............ 250/492.21

FOREIGN PATENT DOCUMENTS 0344646 12/1989 European Pat. Off. .
58-18849 2/1983 Japan ................ 250/396 R
WO87/05438 9/1987 WIPO .

OTHER PUBLICATIONS

Zworykin et al., *Electron Optics and the Electron Microscope*, 1945, pp. 449-452.

*Primary Examiner*—Jack I. Berman
*Attorney, Agent, or Firm*—Herbert Dubno

[57] ABSTRACT

In an ion optical imaging system, especially for lithographic imaging on a wafer, two collecting lenses are provided between the mask and the wafer. At least one of the collecting lenses is a three-electrode grid lens, i.e. a lens in which a grid is disposed perpendicular to the optical axis between a pair of tubular electrodes.

15 Claims, 8 Drawing Sheets

PARTICLE-BEAM IMAGING SYSTEM

FIELD OF THE INVENTION

Our present invention relates to a particle-beam imaging system and, more particularly, to an ion-beam imaging system for use in projection ion-beam lithography, especially for producing semiconductor components and the like.

BACKGROUND OF THE INVENTION

Of the various steps which are required for the production of semiconductor elements, the lithographic step is especially important. Stated most simply, each lithographic step begins by coating a wafer, especially a silicon wafer, with a thin layer of photosensitive material referred to as a photoresist or, simply, a resist, the material of this coating being sensitive to a beam of radiation, for example an ion beam or other particle beam.

A lithographic apparatus projects the beam through a mask provided with a structure to be imaged on the resist, usually in the form of openings in the mask.

Between the mask and wafer, optical elements, i.e. elements capable of modifying the configuration of the beam, can be provided.

The image on the wafer has an extent which is usually far smaller than that of the wafer surface upon which the image is produced. Subsequent to the projection, therefore, the wafer may be shifted and the process repeated so that the same structure of the mask is projected on other locations of the wafer.

The stepping of the wafer through a series of exposures by which the same pattern is imaged on the resist can be repeated until the entire wafer surface coated by the resist is utilized.

A subsequent development of the resist provides the desired pattern on the wafer in the form of resist-free locations. The wafer can then be subjected to any of numerous processes, including etching, ion implantation or coating and diffusion to apply doping elements. After these further steps, the wafer is inspected, recoated with resist and the entire sequence described above is repeated some 8 to 15 times until the result is a checkerboard arrangement of identical microcircuits on the wafer.

Most of the projection lithographic processes used heretofore employ light to irradiate the resist. However, the continuous need for imaging ever smaller structures and the ever higher densities of the components of the microcircuit has mandated the investigation of other radiation methods which are not as limited in resolution as is light with its relatively long wavelength.

Considerable efforts have been made, for example, to attempt to use X-rays in lithographic systems while other processes such as particle-beam lithography and, especially, ion-beam lithography, have been considered as well but with significantly less attention.

In U.S. Pat. No. 4,985,634, an imaging system for lithography purposes is described which comprises a particle source, especially an ion source, a mask provided with a structure to be imaged in the form of one or more components in the mask along the particle or ion beam, means for supporting a wafer in the path of that beam downstream of the mask and, between the mask and the wafer, at least two collecting lenses which are capable of affecting the beam. These collecting lenses are in the form of rotationally symmetrical electrostatic lenses with electrodes of conventional shapes (tubular, diaphragms or combinations thereof) each lens suffering from considerable third-order image distortion which can be only limitedly influenced by the special configuration of the lens geometry. However, by the selection and arrangement of the two lenses this system allowed third-order image distortion to be largely eliminated while a significant fifth-order image distortion, resulting from the product of the aberration coefficient matrix, remained.

OBJECTS OF THE INVENTION

It is the principal object of the present invention to provide a particle-beam imaging system, especially an ion-beam imaging system, particularly for lithographic purposes, and capable of imaging a mask structure formed of one or more openings on a wafer, especially a wafer coated with resist, which substantially eliminates the effect of image distortion of the third order and largely reduces fifth-order distortion.

Another object of this invention is to improve upon earlier two-lens systems so that higher-order image distortion may be eliminated or reduced.

Still another object of this invention is to provide an imaging system of the particle beam and especially the ion-beam type, especially for projection lithography in the production of microcircuits, whereby drawbacks of earlier systems are avoided.

SUMMARY OF THE INVENTION

These objects and others which will become apparent hereinafter are attained, in accordance with the invention, in an imaging system which improves upon the system of this latter patent and reduces the drawbacks thereof or overcomes drawbacks of such systems by providing at least one of the collecting lenses as a three-electrode lens of particular configuration.

More particularly, a particle-beam imaging system, especially for lithographic purposes and generating microcircuits on a wafer, can comprise:

a particle source generating a beam of particles trained on an image plane and traveling along an optical axis of the imaging system;

a mask disposed in a path of the beam upstream of the imaging plane and provided with at least one opening forming a structure to be imaged on the imaging plane;

means for supporting a wafer upon which the structure is to be imaged by the beam at the imaging plane;

two collecting lenses for the beam of particles disposed along the beam between the mask and the wafer, at least one of the lenses being a three-electrode lens including two tube electrodes and a third electrode in the form of a grid between the tube electrodes, the third electrode having a multiplicity of openings and being disposed normal to the optical axis, the grid subdividing the three-electrode lens into a first refractive region including one of the tube electrodes and a second refractive region including the other of the tube electrodes, the regions having different refractivities; and means for applying different potentials to the electrodes of the three-electrode lens.

According to another aspect of the invention, the ion-optical imaging system comprises:

a particle source generating a beam of particles trained on an image plane and traveling along an optical axis of the imaging system;

a mask disposed in a path of the beam upstream of the imaging plane and provided with at least one opening forming a structure to be imaged on the imaging plane;

means for supporting a wafer upon which the structure is to be imaged by the beam at the imaging plane; and two collecting lenses for the beam of particles disposed along the beam between the mask and the wafer, at least one of the lenses being a three-electrode lens including two tube electrodes and a third electrode between the tube electrodes, the third electrode (or grid electrode) being formed as a plate having a plurality of openings and disposed normal to the optical axis, the plate subdividing the three-electrode lens into a positively refractive region including one of the tube electrodes and a negatively refractive region including the other of the tube electrodes.

The perforated plate or grid, therefore, can be located perpendicular to the optical axis and subdivides the lens into two regions, the three electrodes having different voltages applied thereto.

The use of three-electrode lenses with grids as described, especially when both collecting lenses are of this configuration, enables a respective third-order image-distortion coefficient of the imaging equations to vanish for each lens and the remaining image distortion coefficients to be significantly less problematical by comparison with those of conventional electrostatic lenses.

In the imaging system of the invention, for each collecting lens, the third-order distortion can be so greatly reduced that it is practically eliminated. As a result, there is a reduction of the residual distortion at the distortion minimum.

The use of three-electrode lenses with grids, as described, enables the reduction of the mask-wafer distance by comparison with earlier systems for the same distortion values and same image field size.

Furthermore, the depth of field of the imaging system can be substantially increased because the three-electrode lenses with grids as described have only very small image distortions and hence the compensation of image distortions by the lenses between the wafer and mask is significantly less critical.

With the use of three-electrode lenses with grids, moreover, it is possible to provide a particle beam and especially an ion-beam imaging system in which the particle energies at the locations of the mask and wafer are substantially identical. The resist-coated wafer can thus be irradiated with low energy ions or particles (e.g. 10 KeV) so that the particles can be stopped within the resist layer. As a consequence, there is a reduced tendency to generate defect structures and radiation defects generally in the device because of the particle irradiation thereof and the function of the microcircuitry is not affected by high energy particle defects. There is a defect-free transfer of the mask structure to a wafer substrate by the particle beam.

It is also possible to achieve lithographic systems with the three-electrode grid lenses of the invention in which the ion energy at the wafer is very much higher than that at the mask, for example, by a factor of 25, so that higher ion energies (e.g. 100 KeV) can be achieved at the wafer which enables a sufficient penetration depth of ions for a variety of purposes.

To the extent that masks may be used which have only a single aperture, imaging systems can be constructed which employ a singular beam of relatively low energy with high resolution.

According to a feature of the invention, one of the lens regions of the three-electrode lens has positive refractivity while the second lens region has negative refractivity. According to another feature of the invention, the absolute value of the refractive power of the negative lens region (dispersive region) is less than the refractive power of the positively refractive lens region (collecting region).

Such an imaging system allows compensation of the image-error coefficients in spite of the different absolute values of the refractive power when the dispersive region has greater third-order image distortion than the collecting regions.

This construction can be achieved in a simple way, according to a further feature of the invention by providing the tubular electrode of the negatively refractive lens region so that its diameter is smaller, particularly one-half that of the tubular electrode of the positively refractive lens region and when the voltage ratio between the electrodes of the negatively refractive region is significantly less, especially one-half the voltage ratio between the electrodes of the positively refractive region.

The disturbance by, the openings in the plate or grid can be reduced when, according to the invention, substantially identical field strengths are provided for the ion beam on both sides of the perforated plate electrode or grid electrode.

According to a further feature of the invention, the grid electrode is displaceable in the grid plane in two directions including an angle of 90° between them, reciprocatingly. This reciprocating movement reduces the effect of the webs between the openings in the plate or grid electrode on the imaging (transfer of the mask structure to the wafer). This reciprocation by a stroke which is greater than the width of the web between openings of the perforated plate or grid, ensures that particles from each point of the mask will reach the wafer. Furthermore, within the exposure time, each point in the perforated plate or grid plane is transmissive to the same fraction of the total ion flux. Preferably the frequency of reciprocation differs in the two directions of movement of the perforated plate or grid electrode.

Most advantageously, the amplitude of reciprocation is a multiple, generally 5 to 15 times, the width, of the grid openings The reciprocation frequency can be in the range of 100 to 1000 Hz.

The mask-wafer transmission can be improved and fluctuations resulting from the periodicity of the grid reciprocation can be reduced when, according to a further feature of the invention, the diameter of the virtual source of particles or ions is a multiple of the diameter of the grid openings and, especially in the case of grid openings with a width of 5 $\mu$m, amounts to about 60 $\mu$m. For reference to the effect of a virtual source, see European patent application publication A2 0 344 646 published Dec. 6, 1989.

The enlargement of the size of the virtual source does result indeed in an enlargement of the radiation cone deriving from the mask points, but without significant reduction in the resolving capacity since the three-electrode lenses with the grids generate only very small aberrations by comparison to previously used lenses. This allows a much larger virtual particle source to be used, a greater particle flux per unit time to be extracted from the plasma chamber of the source and a more extensive irradiation of the mask.

Improvement in the mask-wafer transmission with the imaging system of the invention can be obtained as well by providing downstream of the particle source, especially an ion source, a multipole to which a variable voltage can be applied and which can be disposed between the source and the mask. The configuration and construction of a multipole is described in European publication 0 344 646 mentioned previously.

The multipole can effect a wobbling of the virtual source electrostatistically and corresponds to comparative shifting of the position of the virtual source with essentially the same effect as an enlarged particle or ion source.

BRIEF DESCRIPTION OF THE DRAWING

The above and other objects, features, and advantages will become more readily apparent from the following description, reference being made to the accompanying drawing in which.

SPECIFIC DESCRIPTION

Figure 6:
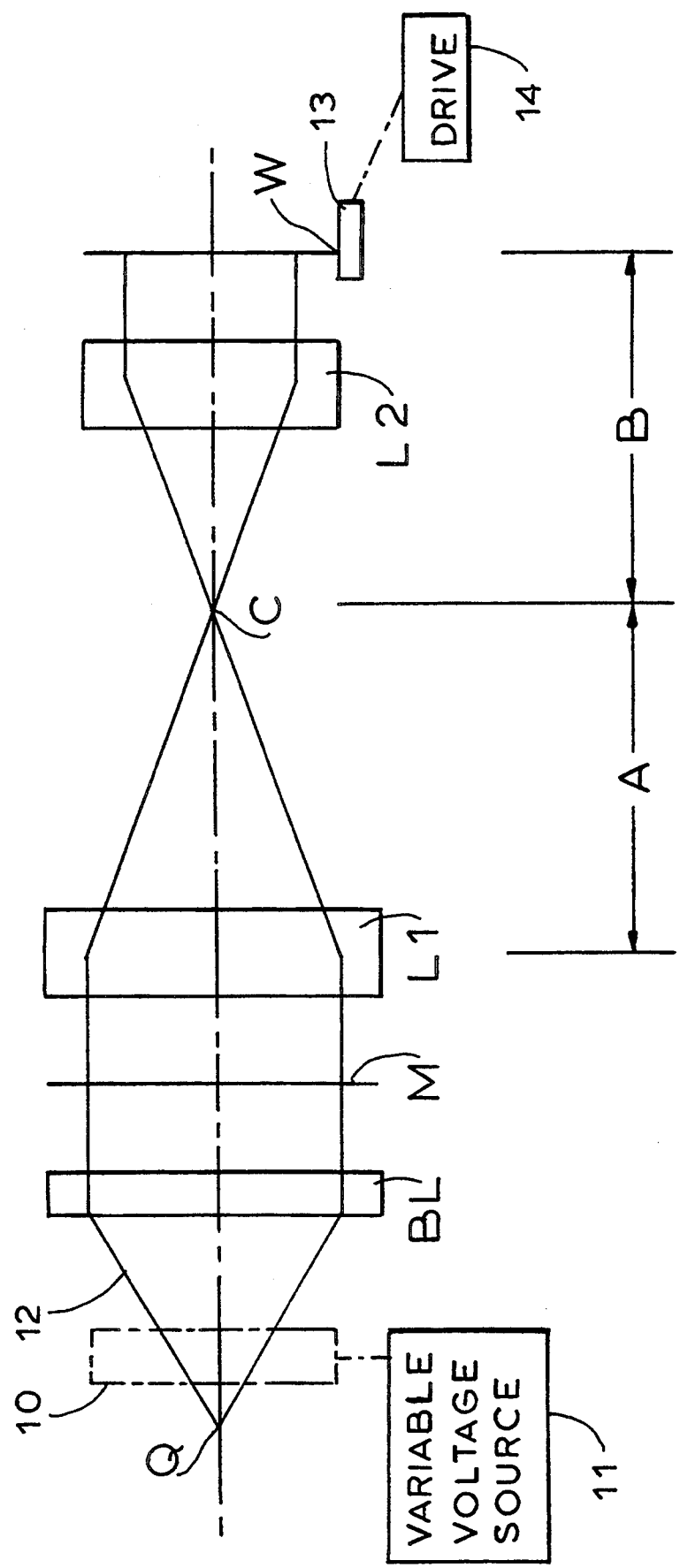
FIG. 6 is a diagram in side view of the construction of an ion lithography system according to the invention.

Referring first to FIG. 6, it can be seen that an ion beam lithographic column or system, according to the invention, can comprise an ion source Q for directing a beam of ions onto a mask M so that the structure thereof, in the form of one or more openings in the mask, can be imaged upon a wafer W which can be assumed to have a resist coating on a surface thereof turned toward the mask and source.

Between mask M and the wafer W are two collecting lenses L1 and L2. Between the ion source and the mask M, an illumination lens B, L is provided to generate a parallel bundle or beam. At least one and preferably both of the collecting lenses L1 and L2 can be a three-electrode lens as will be described in greater detail.

As can be seen from FIG. 6, as well, a multipole 10 can be provided along the optical axis between the source Q and the mask M and can be energized by a variable voltage source 11 so as to increase the spread of the virtual source. An appropriate multipole for this purpose is described in the above-mentioned European patent which also describes the illumination lens and an appropriate ion source. The ion beam 12 is collimated by the illumination lens BL, passes through the mask M and the collecting lens L1 before reaching a crossover C between the lenses L1 and L2 and then is projected by the lens L2 on the wafer W.

The means for supporting the wafer has been represented diagrammatically at 13 and is provided by a drive 14 for stepping the wafer in two mutually perpendicular directions so as to provide the checkerboard pattern of imaging on the wafer as has been described.

Figure 1:
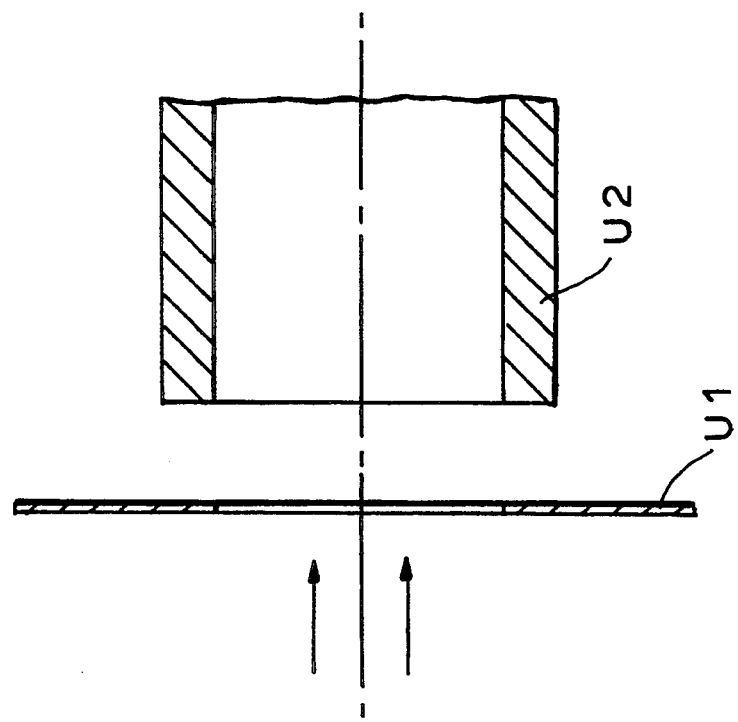
FIG. 1 is an axial longitudinal section through a dispersive lens according to the invention.
Figure 2:
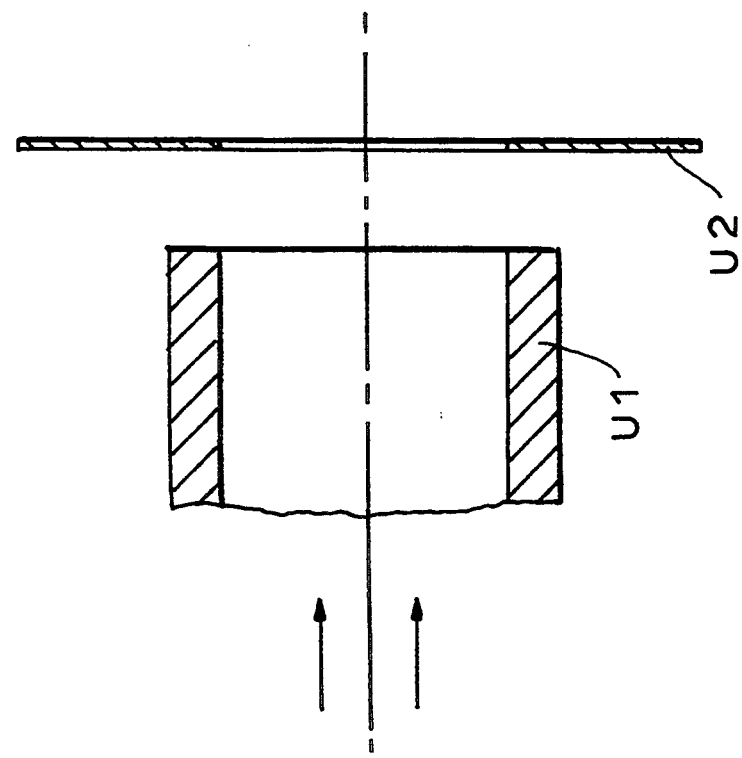
FIG. 2 is a diagrammatic cross section showing a dispersive lens with a different position of the grid electrode from that of FIG. 1.
Figure 3:
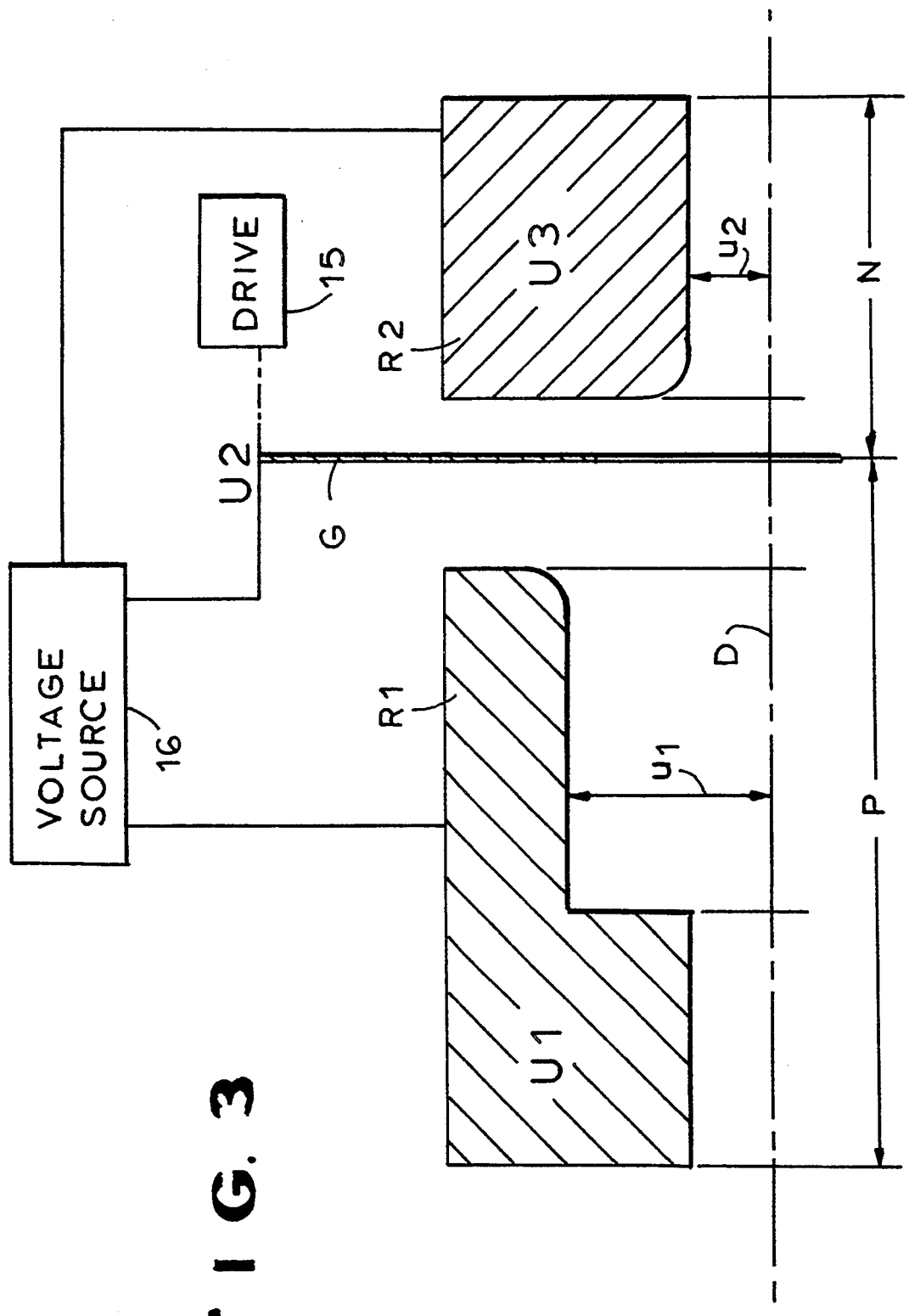
FIG. 3 is an axial cross sectional view in highly diagrammatic form showing three-electrode lens according to the invention with the intermediate electrode being formed as a grid.

The lenses have, as noted, dispersive parts formed by two of the electrodes as illustrated, for example, in FIGS. 1 and 2 and a typical lens L1 or L2 is shown in FIG. 3. The latter comprises tubular electrodes R1 and R2 between which a third electrode in the form of a perforated plate or grid G is provided with a multiplicity of openings.

The grid G can be connected with a further drive 15 (e.g. a piezodrive) capable of displacing the grid in the plane thereof in two mutually perpendicular directions with a reciprocating action. A voltage source 16 is connected to the electrode to apply different potentials to them as will be described in greater detail below.

The perforated plate electrode can be a thin plate provided with a multiplicity of openings, but preferably is a grid in which the openings are separated by mutually perpendicular webs. The grid G is perpendicular to the optical axis D of the imaging system and subdividing the respective lens, e.g. lens L1, into two regions P and N.

The different voltages U1, U2, U3 are applied to the tube electrode R1, the grid G and the tube electrode R2.

To avoid damage to the grid G, the optics of the system are such that no crossover is provided in the region of the or either grid.

For the first lens L1, the optics are such that, for a parallel radiation bundle entering this lens, the crossover (at C of the system) is at the image side focal plane thereof.

In the example given, the lens region P has positive refractivity and the lens region N has negative refractivity. The absolute value of the refractive power of the lens region N of negative refractivity is less than the refractive power of the lens region P of positive refractivity so that the overall refractive power of the three-electrode lens L1 is positive.

As will be apparent also from FIG. 3, the diameter ($2r_2$) of the tubular electrode R2 of the lens region N of negative refractivity is less (approximately half) the diameter ($2r_1$) of the tubular electrode R1 of the lens region P of positive refractivity. The voltage ratio (U3−UO)/U2−UO) between the electrodes of the lens region N of negative refractivity is also smaller than the voltage ratio (U3−UO)/U1−UO) (substantially half) between the electrodes of the region P of positive refractivity UO representing that potential at which the kinetic energy of the charged particles used is 0.

To both sides of the grid electrode G or the perforated plate electrode, the field strength for the two regions P and N are as close to equal as possible.

The perforated plate or grid electrode can be oscillated in two mutually perpendicular directions in the grid plane by the drive 15 as mentioned previously.

The multipole 10 between the source Q and the mask N can be energized with a voltage which continuously varies during operation and has the effect of providing an apparent oscillating movement of the virtual source, thereby preventing imaging of the ribs or webs between the openings of the plate or grid upon the wafer W.

In a concrete embodiment of the three-electrode lens with a grid, the spacing between the ends of the tubular electrodes R1, R2 turned toward one another is 90 mm. The electrode forming the grid G is spaced axially by 60 mm from the discharge mouth of the tubular electrode R1 which has a diameter of 200 min. The inlet mouth of the tubular electrode R2 has a diameter of 100 mm.

The discharge mouth of the tubular electrode R2 is removed from the grid G by 450 mm and the inlet mouth of the tubular electrode R1 lies 900 mm ahead of the grid G.

At a distance of 520 mm from the outlet mouth of the tubular electrode R1, the inner diameter is stepped down from 200 mm to 100 min.

To provide dispersive lens systems, as contrasted with the collecting lenses described, combinations of tubular and plate electrodes can be provided as have been illustrated in FIGS. 1 and 2. The plate must be formed with a multiplicity of openings so that it can effectively constitute a grid, or by a grid having its opening between cross bars, the openings enabling the passage of the particles.

Up to now, grid lenses have not been considered for this use in applications which require high imaging quality, since the bars of the grid do absorb a minor portion of the beam flux, and the individual grid openings effectively act as minilenses or fly-eye lenses.

The grid lenses of the invention, have been developed and improved in such a way that avoid the negative effect of any grid is avoided and only its advantage come into effect.

FIG. 3 shows the principal structural elements of a three-electrode grid lens. As indicated, the lens can comprise two tubular electrodes R1, R2 with radii r1, r2 and a thin grid electrode between them, subdividing the lenses into two regions P and N.

The potentials U1, U2, U3 applied to the three electrodes R1, G and R2 are so selected that the field strengths on both sides of the grid electrode G are as much as possible identical to one another. Distortion through the grid is largely eliminated by this combination. The voltages can be chosen $U1<U2<U3<U0$ or $U0>U1>U2>U3$.

For positively charged particles, and the voltages chosen according to the first case ($U1<U2<U3<U0$), the first region of the lens is dispersive (negative refractivity) and the second region of the lens is collecting (positive refractivity). In the second case ($U0>U1>U2>U3$), the first lens region P functions as a collecting lens and the second region N as a dispersive lens (FIG. 3).

For negatively charged particles, a corresponding relationship applies. In the first case ($U0>U1>U2>U3$), the first lens region P has positive refractivity and the second lens region N has negative refractivity. In the second case ($U1<U2<U3<U0$), the opposite applies.

The resulting refractive power (refractive power of the total lens) is thus given approximately as the sum of the refractive powers of the two partial lenses (regions P and N).

Similarly, the aberration coefficients of third order are given as the sum of the aberration coefficients of the lens regions. Since the aberration coefficients of third order are of opposite sign for collecting lenses and dispersive lenses, it is possible to hold the third order aberration image distortion coefficient sums so that they will be very low and, in many cases, so that one or more of these coefficients can vanish precise- The dispersive part of the lens can have a lesser refractive power than the collecting part of the lens and since the third order aberration is relatively worse for the dispersive part, it is possible to compensate the aberration coefficients by ensuring the above-mentioned relation-ship of the absolute value of the refractive power of the dispersive part.

In a practical way this is achieved by making the diameter of the tubular electrode and the voltage ratio for the dispersive part smaller than (in the case of FIG. 3, half) the diameter of the tubular electrode and the voltage ratio for the collecting part of the lens.

As evidence of the aforedescribed effect of a three-electrode grid lens, the characteristics of a series of lenses of the construction of FIG. 3 were numerically calculated. For this purpose, the lens parameters of first, third, and fifth-order for different values of the radius ratio $r_1/r_2$ as well as the spacing of the two tubular electrodes R1 and R2 from the grid G were calculated as a function of the voltage ratio (U3-U0)/U1-U0).

The potential of the grid electrode G is determined by the condition that equal field strengths will be present on both sides of the grid G.

These calculations are effected as follows:

(1) Calculation of the potential distribution for a given lens geometry by numerical solution of the potential equation by the method of finite differences.

(2) Calculation of the first and third order lens parameters as a function of the voltage ratio (U3-U0)/-(U1-U0) as follows:

Initially the electric field is calculated from the potential values as determined by solution of the potential equation whereby in order to obtain a necessary sufficient precision it is necessary to perform a two dimensional cubic interpolation.

Then a number of particle trajectories through the lenses distributed over the interesting calculation range of the lenses are generated by means of numerical integration. From the positions of the particles at the lens end, the transfer matrix for the first, third and fifth-orders are determined and the errors of the matrix elements are also established. Calculations of this type at different injection energies of the ions [q . (U0-U1), where q = charge of the ions] give the transfer matrix for different voltage ratios.

As results of the sequence of calculations, one obtains from the asymptotically projected trajectories paths the image side and object side focal lengths f, f', the positions of the principle planes and the aberration coefficients of the third and fifth order for the transfer matrix from the object side to the image side focal planes.

From these matrix elements one obtains finally the aberration coefficients $m_{ik}$ defined by the equations (1) and (2) (c.f.E. Harting and F. H. Read, Electrostatic Lenses, Elsevier Scientific Publ. comp., Amsterdam, 1976, P. 15):

$$r_2 = f\Theta_1 + m_{23}\Theta_1^3 + m_{24}(f/f')r_1 - \Theta_1^2 + m_{25}(f/f'^2)r_1^{-2}\Theta_1 + m_{26}(f/f'^3)r_1^3 \quad (1)$$

$$\Theta_2 = -r_1/f + m_{13}\Theta_1^3 + m_{14}(1/f)\Theta_1^2 r_1 + m_{15}(1/f^2) \cdot r_1^2\Theta + m_{16}(1/f^3)r_1^3 \qquad (2).$$

In this relationship we present $r_1$, $\Theta_1$ location (r distance from the Z axis coinciding with the optical axis and direction (angle included with the positive Z axis) respectively of an ion in the object side focal plane and $r_2$, $\Theta_2$ are the location and angle of the same ion in the image side focal plane of the lens.

The so defined coefficients $m_{ik}$ are normalized in the sense that they are independent from an optional similar enlargement or reduction of the dimensions of the respective lens. They can be used, therefore, directly to compare the quality of different lenses.

Figure 4:
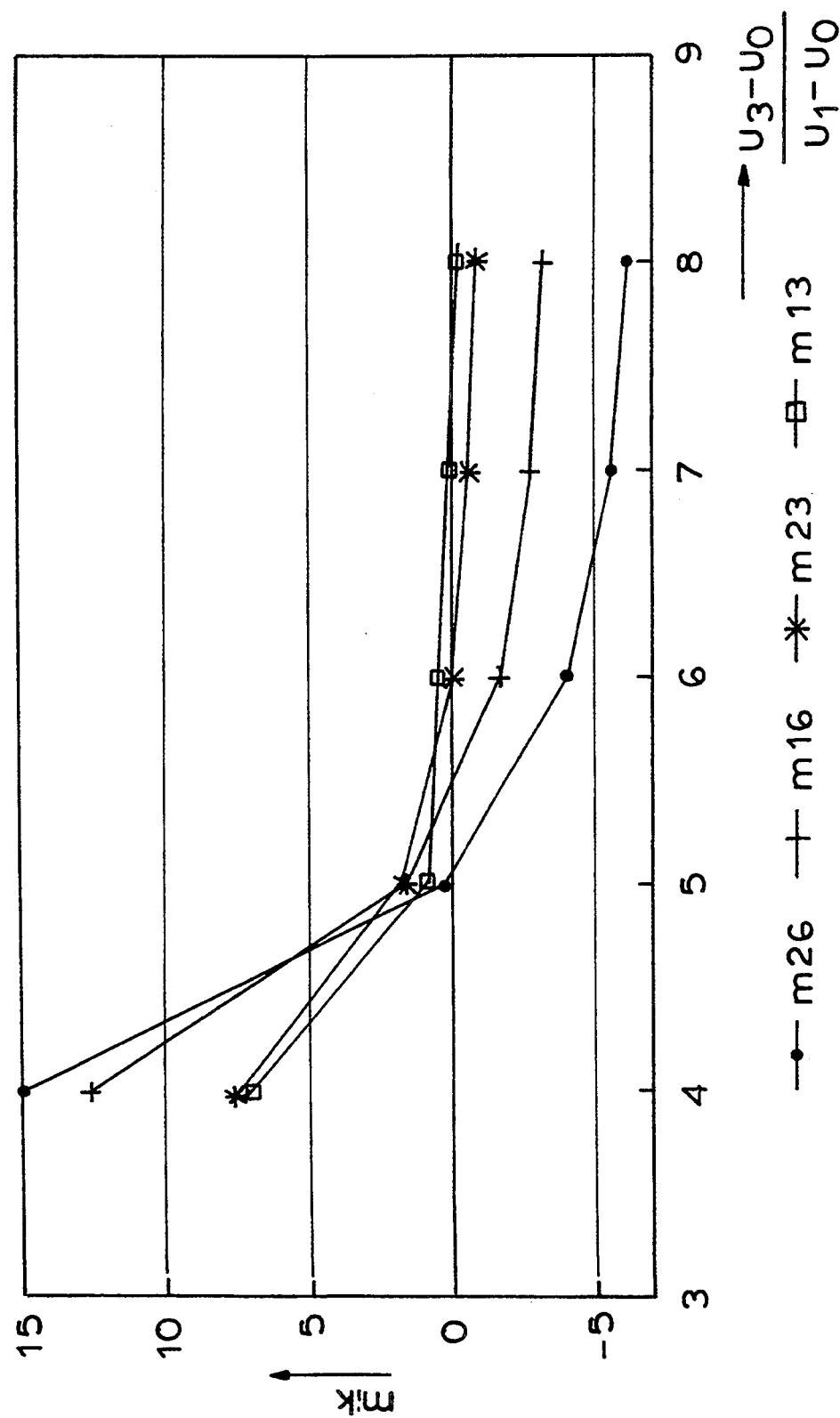
FIG. 4 is a diagram of the third order aberration coefficients as a function of the voltage ratio of a three-electrode grid lens.

FIG. 4 shows several of these normalized image distortion coefficients for the three-electrode grid lens shown in FIG. 3 in dependence upon the voltage ratio (U3-UO/U1-UO). FIG. 6 shows, for the purpose of comparison of these coefficients, those of field lenses of the type hitherto used in ion projection lithography and which are formed as tubular lenses with two electrodes.

Figure 5:
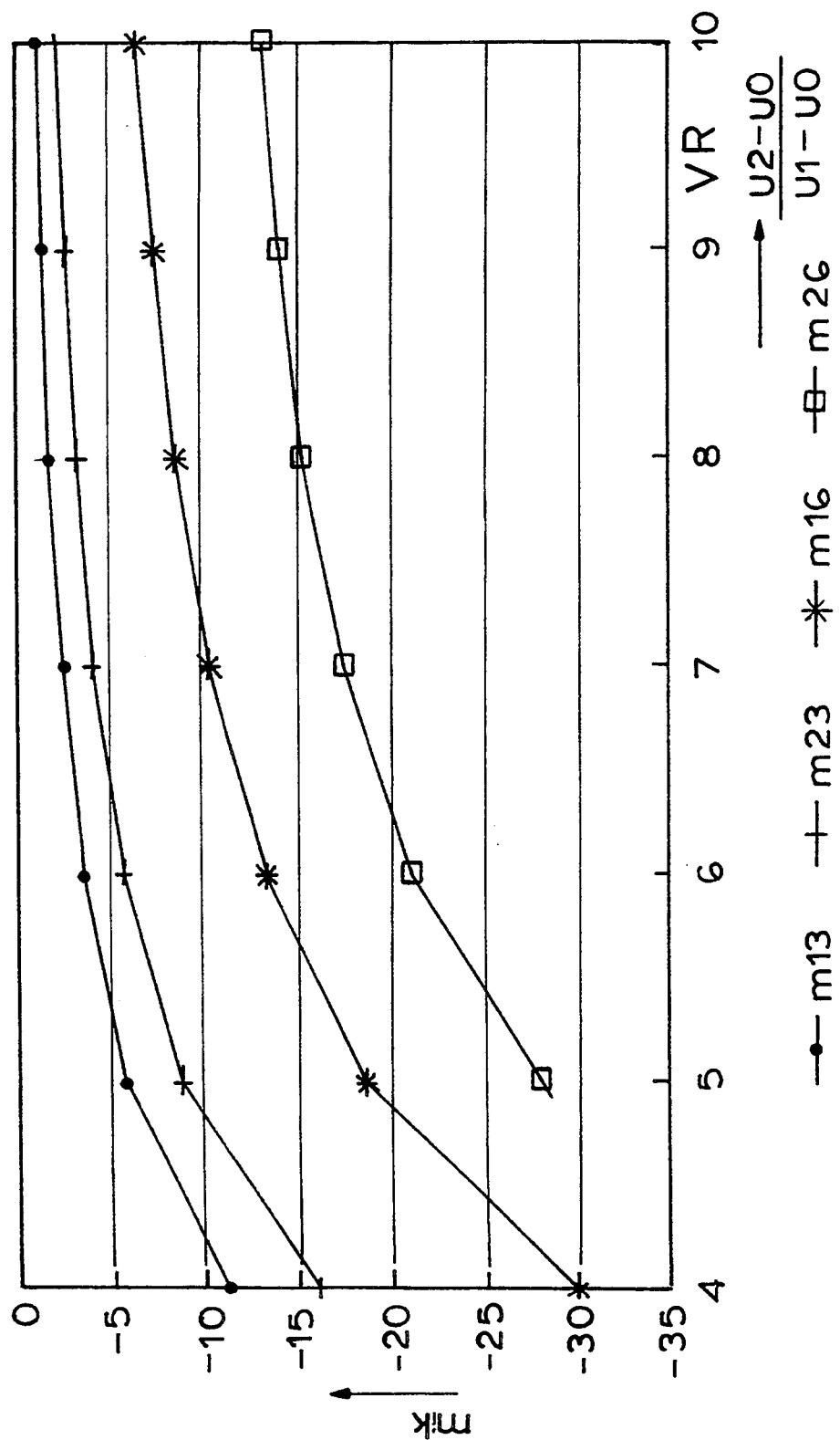
FIG. 5 is a diagram analogous to FIG. 4 but for a two-electrode field lens of conventional construction.

A comparison of the graph of FIG. 4 with that of FIG. 5 demonstrates immediately the improvement of the three-electrode grid lenses of FIG. 3.

It is possible, with the three-electrode grid lens of the invention to exactly nullify each of the image distortion coefficients $m_{13}$, $m_{16}$, $m_{23}$, $m_{26}$, with a given voltage ratio (U3-UO)/U1-UO) whereby at these locations the remaining three coefficients which have not yet exactly vanished will have nevertheless very low values by comparison with those of the field lens (tubular lens).

In order to estimate the image distortions which arise from the grid itself and thereby to determine a suitable degree of fineness of the grid it is sufficient to consider the focusing effect of a structure opening of a radius R which separates a region with a homogeneous field $E_1$ from a region with a different field $E_2$.

This problem has already been dealt with in M. Szilagyi, Electron an Ion Optics, Plenum Press, New York (1988). An arrangement of this kind assumes a collecting lens with the focal length equation $$f_g = 4(U - UO)/E_2 - E_1) \qquad (3)$$

where U is the potential at the location of the opening and $E_2$ and $E_1$ are field strengths ahead of and behind the grid G.

An ion which traverses the opening is deflected by a maximum angle $$|\Delta\Theta| = R/|f_G| = R|(E_2 - E_1)|/|4(U-UO)| \qquad (4).$$

This deflection effects a reduction in the image quality y To hold this effect as small as possible, the diameter (2R) of the grid openings and the field strength difference (E2−E1) between the front and back sides of the grid G must be held as small as possible. With modern grid fabrication techniques it is possible to provide diameters 2R in the range of 5 μm and grid webs with widths of 1 μm to 2 μm between the openings.

With respect to the field strength difference $E_2 - E_1$ it should be observed that it is indeed possible at a given location on the grid, by appropriate selection of the gird potential U2 to ensure exactly equal field strengths $E_1$ and $E_2$ to both sides of the grid G. However, because of the necessary different radii $r_1$ and $r_2$ of the two tubular electrodes R1 and R2 and the radial dependency of the field strengths, the field strengths $E_1$ and $E_2$ are generally different and over the grid range corresponding to the opening of the lens, relative field strength differences of $(E_2 - E_1/E_1)$ of about 1% are inevitable.

If this value is introduced into equation $$|\Delta\Theta| = R/|f_g| = R|(E_2-E_1)|/|4(U-UO)| \qquad (4),$$

the equality becomes $|\Delta\Theta| \approx 10^{-8}/L(m)$, where L is a measure of the linear extent of the field of the grid lens and corresponds or is approximately equal to the distance between the tubular electrodes R1, R2 (FIG. 3).

Since the dimension L lies in a range of multiples of 10 cm, it is possible to reduce the angular deflection according to equation (4) to a value of $1 \times 10^{-8}$ to $10 \times 10^{-8}$, which in most cases is negligible by comparison to other aberrations (for example, chromatic blurring). Of course this only applies when the field strengths $E_1$ and $E_2$ are optimally matched as has been described.

For simple grid lenses as in FIGS. 1 and 2, in which a field is provided only to one side of the grid, the deflection is higher by a factor of about 100, i.e. ($|\Delta\Theta| \approx 10^{-6}$ to $10^{-5}$). Lenses of this type without the second field, therefore, cannot be utilized for the purposes of the present invention.

FIG. 6 details the effect of two collecting lenses L1 and L2, each of which is a three electrode grid lens, in an ion optical imaging system.

The mask M which can form the structure to be imaged in the form of openings in a foil, for example silicon foil, is illuminated from an ion source with a very small virtual source size (approximately 10 μm) through an illuminating lens BL transforming the ion beam divergent from the virtual source over into a parallel beam on irradiation of the mask. The mask is located approximately at the focal plane of the first collecting lens L1 following the mask M.

The collecting lens L1 generates a crossover C (real image of the ion source Q) shortly behind the image side focal point.

The object side focal point of the second collecting lens L2 disposed directly ahead of the wafer W is found at the location of the crossover C. As a consequence, the beam leaves the collecting lens L2 as a parallel bundle and is directed onto the wafer. The result is an approximately telecentric imaging system.

This has the advantage that the imaging reduction ratio does not change with small changes in the position of the wafer W along the ion optical axis.

This system has the following characteristics which are independent of the particular construction of the two collecting lens L2 and L2.

(a) The image field resolving the structure of the mask is reproduced in the vicinity of the image side focal point of the lens L2 disposed ahead of the wafer W when the mask, as described, is located in the region of the object side focal point of the collecting lens L1 immediately following the mask M.

(b) The ion beam bundle traversing a conventional collecting lens L1 following the mask M generally has a barrel shaped distortion (region A) that after the crossover C is transformed into a pin cushion distortion (region B). With the use of the three-electrode grid lens as collecting lenses L1 and L2 it is possible to provide in the region A a pin cushion distortion and in region B a barrel shaped distortion.

Figure 7:
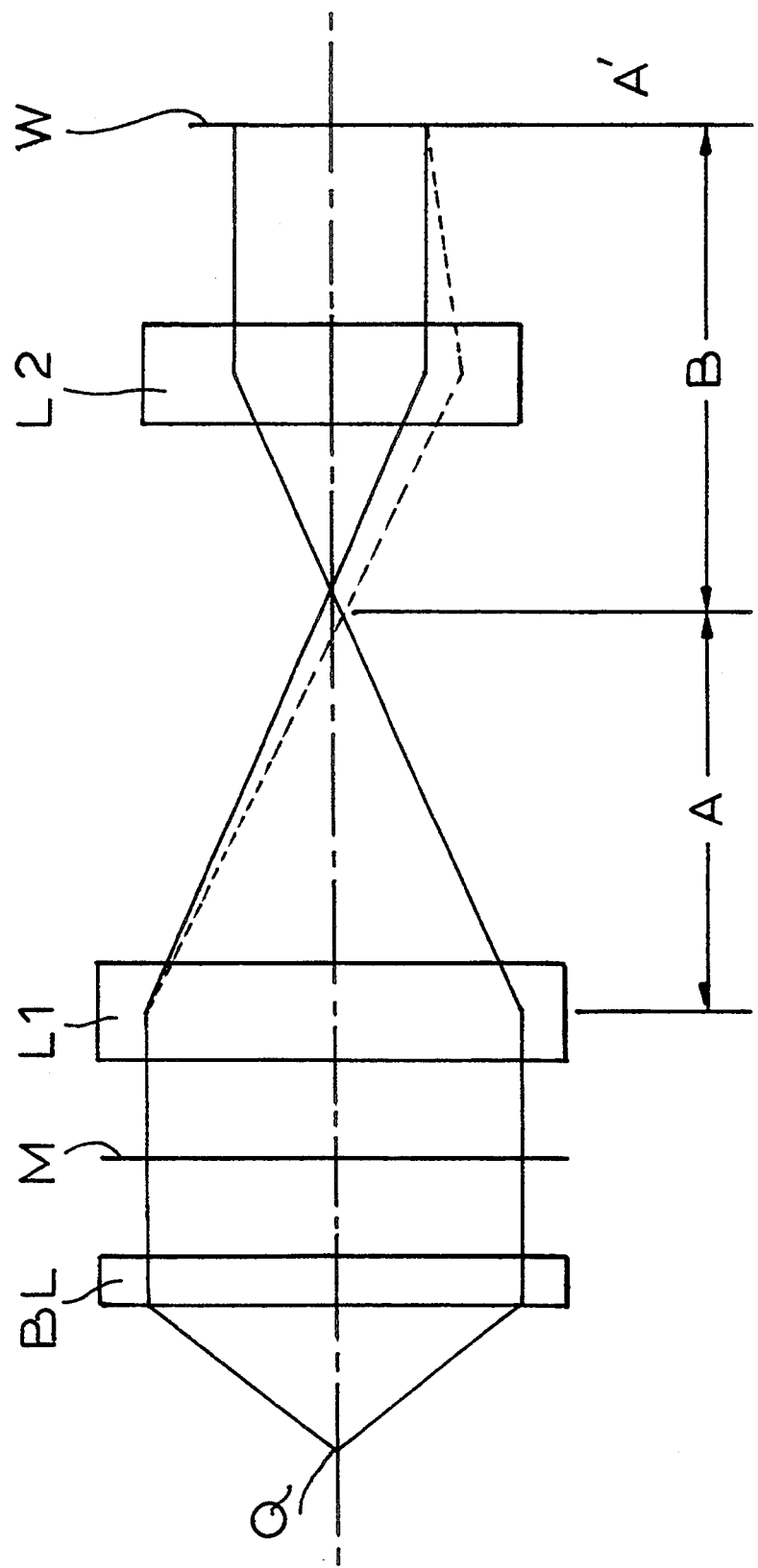
FIG. 7 is a diagram similar to that of FIG. 6 but with distortion correction.

FIG. 7 shows the case where a barrel shaped distortion in region A and a pin cushion distortion in region B can result, utilizing the invention, in an additional deflection ahead of the wafer side collecting lens L2 which reduces the pin cushion distortion in region B and generates a region A' with a barrel shaped distortion.

As a result, behind the wafer side collecting lens L2 there is a plane in which the distortions through the lens L1 and L2 are compensated. This applies only for the image distortion of third order and there remain, although highly reduced, image distortions of fifth order, i.e. distortions which are not completely nullified although they are reduced to a minimum.

For a given image field size, these residual distortions are inversely proportional to the fifth power of the spacing between the mask M and the wafer W, all other parameters being the same and a corresponding change being made in the other dimensions of the optical system with the mask M and the wafer W.

Figure 8:
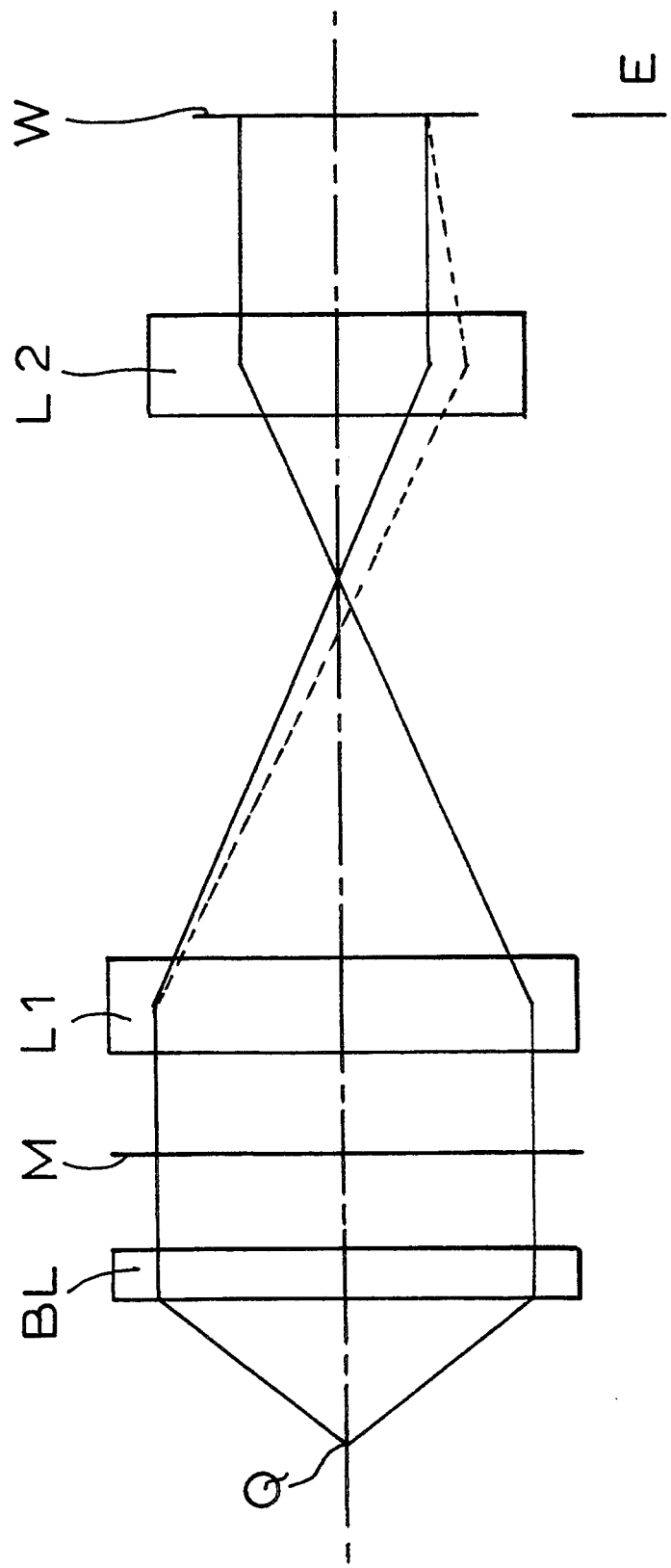
FIG. 8 is a diagram similar to FIGS. 6 and 7 with chromatic blurring or aberration correction.
Figure 9:
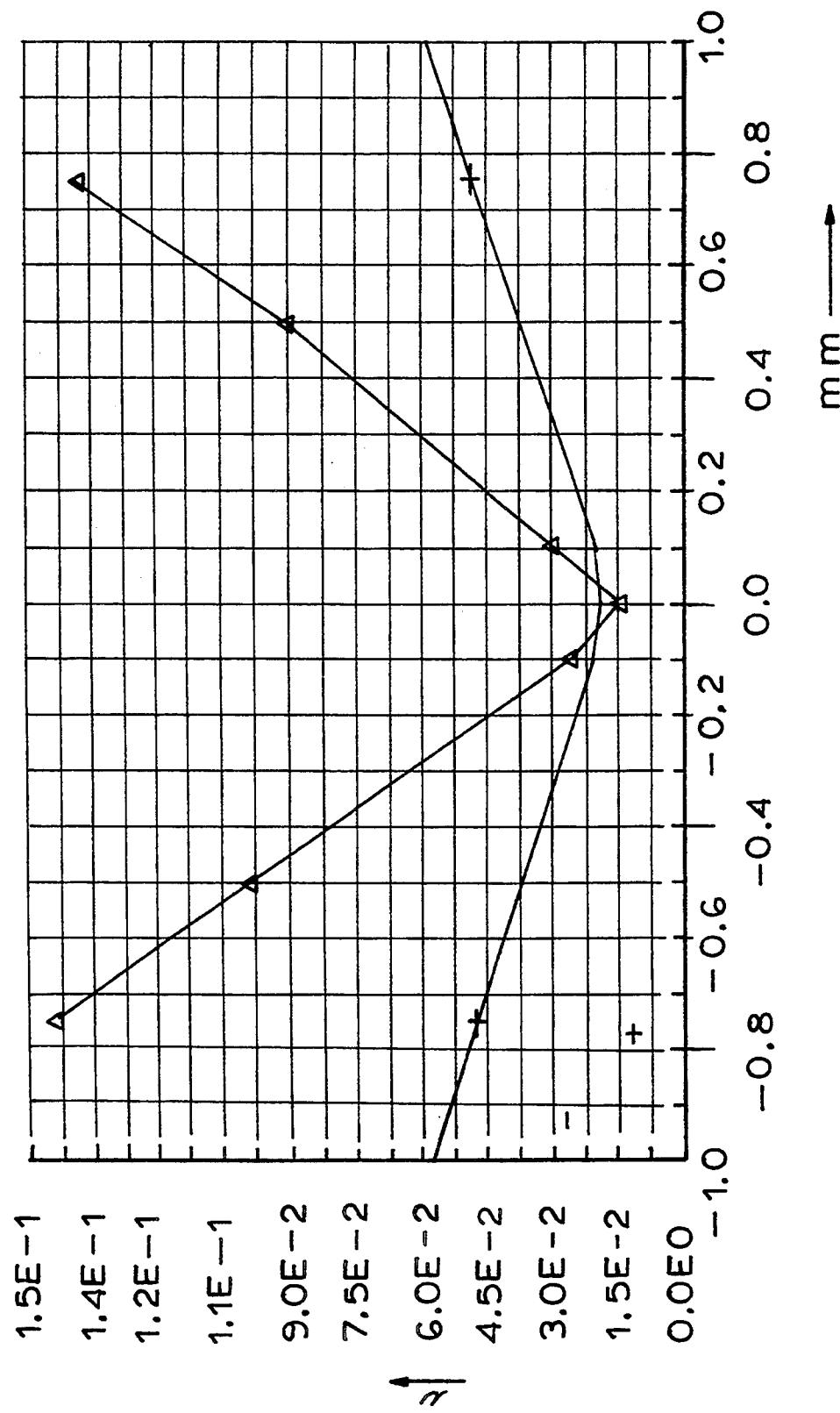
FIG. 9 is a diagram plotting distortion and chromatic aberration as a function of the location of the wafer along the optical axis.

(c) In the arrangement of FIG. 6, as will be apparent from FIG. 8, there is also a compensation for the chromatic aberration or blurring as a result of the effects of the two collecting lenses L1 and L2 for a given image plane E behind the second collecting lens L2 ahead of the wafer W. A beam (represented in FIG. 8 by a broken line for the case in which the index of refraction change of the collecting lens L1 is less than that of collecting lens L2) with a somewhat smaller energy $E_0 - \Delta E_0$ than the set point energy $E_0$ is more strongly deflected in the first collecting lens L1 following the mask M and, as a result, enters the second lens L2 arranged ahead of the wafer W at a greater distance from the axis than the setpoint beam (shown as a continuous line trace) and for this reason and because of its lesser energy is deflected back toward the optical axis to a degree that it will meet the setpoint beam at a given distance behind the collecting lens L2 arranged ahead of the wafer W. In this plane E there is a disappearance of the chromatic aberration of first order. There remains even here, however, a residual distortion in the form of a second order chromatic aberration i.e. an aberration proportional to the square of the energy deviation from that of the setpoint beam. (The combination of two three-electrode grid lenses can also be so operated that the refractive power change of the lens L1 is greater than that of the lens L2. An analogous result is then obtained).

(d) The three relevant planes, i.e. the Gaussian image plane of the mask M (FIG. 6), the plane of minimal distortion (FIG. 7) and the plane of minimal chromatic distortion (FIG. 8) in general do not coincide. By suitable choice of the collecting lenses L1 and L2 and the position of the ion source Q in the ion-optical axis, it can be observed that, while maintaining the approximate parallel beam path the three mentioned planes will coincide. In that case, the wafer W is located at the plane in which the three planes coincide so that in the thus selected image plane of the mask M, i.e. the location at which the wafer W is disposed, there is simultaneously a minimum image distortion as well as a minimum in the chromatic blurring.

(e) The imaging ratio, i.e. the reduction factor, with which the structure of the mask M is imaged on the wafer W is given approximately by the ratio of the image-side focal length of the first collecting lens L1 following the mask M to the object side focal length of the second collecting lens L2 arranged ahead of the wafer W, by scaling (e.g. increasing or decreasing the size of the lens L2) it is, however, possible to vary the reduction factor of the imaging system while maintaining all other characteristics (simultaneous correction of image distortion and chromatic blurring at the Gaussian image point of the mask).

The three-electrode grid lenses of the present invention in the context of the ion optical imaging system described have a number of advantages:

(a) Third order image distortions can be sharply reduced for each of the two collecting lenses L1 and L2. Since the beam in the object side focal plane of lens L1 is approximately a parallel beam and the crossover C lies in the object side focal plane of lens L2, the distortion generated by these lenses is given by coefficients $m_{26}$ for lens L1 and $m_{13}$ for lens L2 respectively as previously described which can vanish exactly by appropriate selection of the voltage ratios at the electrodes of the lenses. The freedom from third order distortion, therefore, no longer occurs in a single plane but rather over an entire range which reduces the boundary conditions which must be complied with and hence reduces limitations on the construction of the system.

(b) A still greater advantage is the reduction of the residual image distortion at the location of the distortion minimum. This is a consequence of the fact that at the location of the distortion minimum, the significant coefficient for the fifth-order distortion is largely a product of the third order distortion coefficients of the two lenses L1 and L2. With the three electrode grid lenses of the invention, the contributions to this product are practically vanishing and thus the residual distortion is any caused by the very small fifth order terms of the lenses.

As examples two separate arrangements were numerically simulated with high precision:

One arrangement A utilized approximately identical ion energies at the mask and wafer and the second arrangement B accelerated the ions between mask and wafer by a factor greater than unity.

Corresponding to requirements of the semiconductor industry, the imaging of a mask M formed with a structure of openings within an area of $60 \times 6$ mm$^2$, was effected on a chip area of $20 \times 20$ mm$^2$ on a wafer W utilizing a lens system as shown in FIG. 6. The illuminating lens BL was an Einzel lens which generated an approximately parallel ion beam at the location of the mask M.

The first collecting lens L was a three electrode grid lens according to FIG. 3 on the electrodes of which voltage ratios were applied which caused vanishing of the coefficient $m_{26}$ (equation 1 and FIG. 4).

The second collecting lens L2 was also a three electrode grid lens as shown in FIG. 3. In case A this lens was traversed from right to left and utilized as a retarding lens so that, the ion energies at the location of the mask M and at the location of the wafer W were approximately the same. In case B, the second collecting lens L2, like the first collecting lens L1 was operated as accelerating lens, i.e. traversed from left to right. The voltage ratio at collecting lens L2 in both cases was chosen so that the coefficient $m_{13}$ vanished.

The simulation of the imaging of the mask structure was effected by the standard method of matrix manipulation. For the collecting lenses L1 and L2 the fifth-order transfer matrices were calculated by the above mentioned methods.

These calculations were repeated utilizing an optimization program with slight variation in the starting parameters until a minimum of the image distortion and a chromatic aberration at the location of the Gaussian image point of the mask structure on the wafer was achieved.

The following considerations also apply:
(a) Parallel beam at the output of the imaging system (i.e. ahead of the wafer and behind the collecting lens L2 position ahead of the wafer.
(b) Gaussian imaging of the mask M on the wafer W.
(c) Imaging ratio mask: wafer 3:1.

The following parameters were varied for the determination of the image distortion minimum while the boundary conditions were maintained.
(a) Distance between the mask M and the collecting lens L1 following same.
(b) Distance between the two collecting lenses L1 and L2.
(c) Distance between the wafer W and the collecting lens L2 ahead of the wafer.
(d) Scaling factor, i.e. enlargement or reduction of the collecting lens L2 ahead of the wafer W.

For further optimization, the voltage ratios between the electrodes of the two collecting lenses L1 and L2 are varied. It turned out that the ratios selected to start with corresponding to $m_{26}=0$ for L1 and $m_{13}=0$ for L2, were almost optimal.

An effort was also made to determine whether resolution limitations developed as a function of the final size of the grid openings. A diameter 2R of 5 $\mu$m was selected for the grid openings. This investigation was based upon the following:
1. The maximum value of the field strength difference $E_2-E_1$ for the illuminated part of the grid was calculated from the potential distribution of the lenses.
2. With the aid of equation (3), the focal length of the "grid opening mini lens" and the resulting maximum deflection of the boundary beam of a grid opening were calculated.
3. By the described matrix methods, the deflection angle was transformed into corresponding spatial deviations at the location of the wafer W. These calculations were carried out separately for the collecting lenses L1 and L2 and, following these calculations, the results were added to determine a secure upper boundary for the effect of the grid openings. The results of these calculations are summarized in the following table.

TABLE

|  | ARRANGEMENT A | ARRANGEMENT B |
|---|---|---|
| Design Field of Mask M | 60 × 60 mm² | 60 × 60 mm² |
| Voltage Ratio of Collecting Lens L1 | 5.90 | 5.57 |
| Scaling[1] of Collecting Lens L1 | 1.50 | 1.04 |
| Voltage Ratio of Collecting Lens L2 | 0.1713 | 6.07 |
| Scaling[1] of Collecting Lens L2 | 0.50 | 0.93 |
| Distance Mask M - Wafer W | 3.15 m | 3.00 m |
| Reduction Factor | 3.0 | 3.0 |
| (Ion Energy)$_{Wafer}$/(Ion Energy)$_{Mask}$ | 1.01 | 33.8 |
| Maximum Distortion[2] (within the 20 × 20 mm² illumination field of Wafer W) | 0.015 $\mu$m | 0.030 $\mu$m |
| Maximum Chromatic Blurring (based on the energy spread[3]) | 0.019 $\mu$m | 0.035 $\mu$m |
| Maximum Blurring Based on Lens Effect of the Grid Openings[4] | 0.020 $\mu$m | 0.037 $\mu$m |

[1] Similar enlargement or reduction relative to FIG. 3.
[2] Maximum deviation of an image point from the ideal image.
[3] For energy spread of the ions at ion source output of $\Delta E = \pm 3$ Ev, where E is the energy of the ions at the output of the ion source.
[4] For grid openings of 5 $\mu$m diameter.

It was found that a structure of a mask field of 60 $\mu$mm×60 mm could be imaged on a wafer with a reduction by a factor of 3 and that simultaneously a minimum of the image distortion and blurring of the image as a result of chromatic aberration caused by lack of sharpness of the ion energy could be achieved at the location of the image. The maximum distortion at the location of the image as a result of fifth-order image distortion in the total field was less than 0.015 $\mu$m (case A) and less than 0.03 $\mu$m in case B. The blurring of the image was less than 0.04 $\mu$m (case A) and less than 0.07 $\mu$m (case B) for a mask-wafer distance of about 3 meters.

If one compares these results with the values in U.S. Pat. No. 4,985,634, the improvement obtained with the use of three electrode grid lenses as collecting lenses between the mask and wafer will be apparent.

The machine in U.S. Pat. No. 4,985,634, with a machine length (mask-wafer spacing) of 2.1 m and an image field of 10 mm×10 mm had a maximum distortion of less than 0.2 $\mu$m. For a comparison of the two systems, the distortion values must be normalized to the same image field sizes. By such normalization, it can be found that in an ion projection lithographic system according to this United States Patent for an image field of 20 mm×20 mm when a maximum distortion of 0.4 $\mu$m is to be reached, the machine length must be increased to 4.2 m (an increase in the system factor by a factor of 2) with the use of three electrode grid lenses according to the invention the length of the ion projection system can be reduced by approximately 15% (of 4.2 m) and simultaneously the distortion reduced by a factor of 10-20. This difference greatly increases the applicability of ion projection lithographic systems with three electrode grid lenses.

With three electrode grid lenses of the invention, moreover, the depth of field can be significantly increased since the image distortions of the collecting lens L1 and L2 are so small that compensation of aberration is less critical.

In the use of three electrode grid lenses in an ion beam lithographic system according to the invention, the illumination of the mask M by an ion source Q with very small virtual source size (approximately 10 $\mu$m) requires the following observations:

With previously used ion sources of limited virtual source size, a highly inhomogeneous intensity developed within the illumination field. In this case, from a mask point, a beam ion is trained on the location of the grid with a size which could be of the same order of magnitude as that of the grid opening. The mask-wafer transmission would vary strongly with the periodicity of the grid if such a grid was used. This can be overcome by wobbling of the grid by using a more extended virtual ion source or by periodic (wobbling) of the virtual source.

Since it is important that ions on wobbling of the grid reach the wafer from every point of the structure of the mask., the grid is so moved that within the illumination time, each point on the grid plane is transverse to the same fraction of the total ion flux. This is achieved by shifting the grid in two mutually perpendicular directions in the grid plane with two different frequencies and with an amplitude corresponding to several grid opening diameters. This means an oscillation amplitude in each direction of several 10 $\mu m$ and frequencies in the range of 100 to 1000 Hz, preferably utilizing a piezoelectric driver which has been found to be free from problems.

In earlier ion lithographic systems, ion sources with virtual source size were required which were so small that the opening angle of the beam cone could be minimized and the aberrations at the lens L1 and L2 should have no significant effect with respect to the resolution. These requirements meant that the source diameter had to be approximately 10 $\mu m$. With the present invention, therefore, while such sources can still be used, the image distortions are so much smaller that significantly larger opening angles and ion source sizes can be used.

Numerical calculations have indicated that in arrangements like those of the table, a virtual source size of 60 $\mu m$ in diameter will only contribute 7 nm to the resolution in case A and 14 nm to the resolution in case B. This effect is extremely small compared to other effects on resolution. With such large virtual sources, as can also be demonstrated by calculation, the spread of the beam bundle from a mask point at each of the two grids of the lens L1 and L2 is about 30 $\mu m$, covering a region of 20 grid openings, thereby ensuring a practically uniform transmission from the mask to the wafer. This can easily be achieved in the system of the invention and has the further advantage that the space charge at the location of the crossover C (FIG. 6) is significantly smaller so that undesired space charge effects can be avoided. With a 60 $\mu m$ source Q, a significantly higher beam current can be achieved.

An enlarged ion source can also be simulated by electrostatically wobbling the ion beam illuminating the mask. This corresponds to a periodic shift of the source transverse to the ion optical axis. This can be achieved also by providing at an appropriate location between the ion source and the illumination lens BL, the electrostatic multipole as has been described and varying as a function of time the dipole fields in the X and Y directions. The directions in which the beam impinges on the mask is thereby varied also as a function of time, corresponding thereto a shift in the virtual source in the X and Y directions and therefore to a spreading of the ion source.

We claim:

1. A particle imaging lithographic system, comprising:
a particle source generating a particle beam trained on an image plane and traveling along an optical axis of the imaging system;
a mask disposed in a path of said beam upstream of said imaging plane and provided with at least one opening forming a structure to be imaged on said imaging plane;
means for supporting a wafer upon which said structure is to be imaged by said beam at said imaging plane;
two collecting lenses for said ion beam disposed along said beam between said mask and said wafer,
at least one of said lenses being a three-electrode lens including two tube electrodes and a third electrode in the form of a grid between said tube electrodes, said third electrode having a multiplicity of openings and being disposed normal to said optical axis, said grid subdividing said three-electrode lens into a first refractive region including one of said tube electrodes and a second refractive region including the other of said tube electrodes, said regions having different refractivities; and
means for applying different potentials to said electrodes of said three-electrode lens.

2. The imaging system defined in claim 1 wherein said first region has positive refractivity and said second region has negative refractivity, the absolute value of the negative refractivity of said second region being less than the positive refractivity of said first region.

3. The imaging system defined in claim 2 wherein said tube electrode of said second region with negative refractivity has a diameter less than a diameter of said tube electrode of said first region with positive refractivity and a voltage ratio between potentials applied to said second region with negative refractivity is less than a voltage ratio between potentials applied to said first region of positive refractivity.

4. The imaging system defined in claim 3 wherein said tube electrode of said second region with negative refractivity has a diameter which is substantially half the diameter of said tube electrode of said first region with positive refractivity and the voltage ratio between potentials applied to said second region with negative refractivity is substantially half of the voltage ratio between the potentials applied to said first region of positive refractivity.

5. The imaging system defined in claim 1 wherein said potentials are so applied that on opposite sides of the grid, substantially equal electrical field strengths are maintained.

6. A particle-beam imaging system, comprising:
a particle source generating a beam of particles trained on an image plane and traveling along an optical axis of the imaging system;
a mask disposed in a path of said beam upstream of said imaging plane and provided with at least one opening forming a structure to be imaged on said imaging plane;
means for supporting a wafer upon which said structure is to be imaged by said beam at said imaging plane; and
two collecting lenses for said beam of particles disposed along said beam between said mask and said wafer,
at least one of said lenses being a three-electrode lens including two tube electrodes and a third electrode between said tube electrodes, said third electrode being formed as a plate having a plurality of openings and disposed normal to said optical axis, said plate subdividing said three-electrode lens into a positively refractive region including one of said tube electrodes and a negatively refractive region including the other of said tube electrodes.

7. The imaging system defined in claim 6, further comprising a multipole in line with said source, and a variable voltage supply connected to said multipole.

8. The imaging system defined in claim 7 wherein said multipole is disposed between said source and said mask.

9. The imaging system defined in claim 1 or 6 wherein said grid is formed with openings of widths which are substantially larger than widths of webs between said openings.

10. The imaging system defined in claim 9 wherein the widths of said openings are substantially 3 to 5 times the widths of said webs.

11. The imaging system defined in claim 9 wherein the widths of said openings are substantially 5 $\mu$m and the widths of said webs are 1 to 2 $\mu$m.

12. The imaging system defined in claim 1 or 6 wherein said grid is provided with means for displacing said grid in a plane thereof in two directions including an angle with one another.

13. The imaging system defined in claim 12 wherein said angle is 90°.

14. The imaging system defined in claim 1 or 6 wherein said source forms a virtual source of ions with an effective diameter which is substantially greater than widths of openings in said grid.

15. The imaging system defined in claim 14 wherein said virtual source of ions has an effective diameter of substantially 60 $\mu$m and said openings in said grid have widths of about 5 $\mu$m.

* * * * *